United States Patent
Haddad

(10) Patent No.: US 8,848,452 B1
(45) Date of Patent: Sep. 30, 2014

(54) ERASE VERIFICATION CIRCUITRY FOR SIMULTANEOUSLY AND CONSECUTIVELY VERIFYING A PLURALITY OF ODD AND EVEN-NUMBERED FLASH MEMORY TRANSISTORS AND METHOD THEREOF

(71) Applicant: Spansion LLC, Sunnyvale, CA (US)

(72) Inventor: Sameer Haddad, San Jose, CA (US)

(73) Assignee: Spansion LLC, Sunnyvale, CA (US)

(*) Notice: Subject to any disclaimer, the term of this patent is extended or adjusted under 35 U.S.C. 154(b) by 0 days.

(21) Appl. No.: 13/856,816

(22) Filed: Apr. 4, 2013

(51) Int. Cl.
G11C 16/34 (2006.01)
G11C 16/16 (2006.01)
G11C 16/04 (2006.01)

(52) U.S. Cl.
CPC ............ *G11C 16/3445* (2013.01); *G11C 16/16* (2013.01); *G11C 16/0483* (2013.01)
USPC ............ 365/185.22; 365/185.26; 365/185.27; 365/185.33; 365/185.29; 365/185.17

(58) Field of Classification Search
CPC . G11C 16/16; G11C 16/3445; G11C 16/0483
USPC ............. 365/185.12, 185.11, 185.17, 185.22, 365/185.26, 185.27, 185.33, 185.29
See application file for complete search history.

(56) References Cited

U.S. PATENT DOCUMENTS

| | | | | |
|---|---|---|---|---|
| 5,428,568 | A * | 6/1995 | Kobayashi et al. ...... | 365/185.24 |
| 6,975,538 | B2 * | 12/2005 | Abedifard et al. ....... | 365/185.19 |
| 7,187,586 | B1 | 3/2007 | Wong et al. | |
| 7,391,654 | B2 * | 6/2008 | Aritome ................... | 365/185.29 |
| 2005/0270835 | A1 | 12/2005 | Chevallier | |
| 2008/0165585 | A1 | 7/2008 | Surico et al. | |
| 2010/0202207 | A1 | 8/2010 | Mokhlesi | |
| 2011/0032761 | A1 | 2/2011 | Sarin et al. | |

OTHER PUBLICATIONS

International Search Report and Written Opinion of the International Searching Authority directed to related International Patent Application No. PCT/US2014/032495, mailed Jul. 28, 2014; 13 pages.

* cited by examiner

*Primary Examiner* — Andrew Q Tran
(74) *Attorney, Agent, or Firm* — Sterne, Kessler, Goldstein & Fox P.L.L.C.

(57) ABSTRACT

Embodiments described herein generally relate to verifying that a FLASH memory has been erased. In an embodiment, a method of erase verifying a memory column of a FLASH memory includes applying a pass gate voltage to even numbered memory transistors while applying an erase verify voltage to the odd numbered memory transistors. Applying a string current to the memory column allows a probe to determine if the string current is successfully traversing the memory column, and thus verifying that the odd numbered memory transistors were erased. The even numbered memory transistors are verified in the following cycle.

20 Claims, 6 Drawing Sheets

ERASE VERIFICATION CIRCUITRY FOR SIMULTANEOUSLY AND CONSECUTIVELY VERIFYING A PLURALITY OF ODD AND EVEN-NUMBERED FLASH MEMORY TRANSISTORS AND METHOD THEREOF

BACKGROUND

1. Technical Field

The embodiments described herein generally relate to non-volatile memory, such as FLASH memory.

2. Background

FLASH memory retains information stored therein without power, and thus is considered "non-volatile" memory. As such, FLASH memory has become increasingly popular for many types of devices including, for example, removable storage devices and mobile computing devices. Unlike other non-volatile memories that are one-time programmable (OTP), FLASH memories can be overwritten by a memory controller. Typically, data is stored in FLASH memory by erasing its contents and then writing to a block of cells. A memory controller tracks which blocks have been erased, and which ones are presently storing data. In practice, voltage is applied to FLASH memory to erase its contents. The process of erasing a FLASH memory block and programming selective cells within the block is referred to as a "program/erase cycle" or "P/E cycle."

Some characteristics of FLASH memory tend to degrade as the FLASH memory experiences more P/E cycles. For example, the FLASH memory may not be able to store its contents for an infinitely long period of time without power. Moreover, the FLASH memory's programming and erasing characteristics may also degrade. Accordingly, techniques to improve FLASH memory performance characteristics are desirable.

BRIEF SUMMARY

Embodiments described herein include methods, systems, circuitry, semiconductors and devices for adaptively programming or erasing a memory block.

In an embodiment, a method is directed to erase verify of at least a portion of a memory column. The memory column includes an arrangement of memory transistors. The method comprises applying an erase voltage to the memory column. The erase verify voltage is applied to first memory transistors in the memory column while a pass gate voltage is applied to second memory transistors in the memory column. A verification electrical level is read to determine whether any of the first memory transistors were not successfully erased. The erase verify voltage is applied to third memory transistors in the memory column while the pass gate voltage is applied to fourth memory transistors in the memory column. The verification electrical level is read to determine whether any of the third memory transistors were not successfully erased.

In an embodiment, memory circuitry comprises a memory column that includes an arrangement of memory transistors. An erase verify voltage source is configured to generate an erase verify voltage, and is coupled to first memory transistors in the memory column. A pass gate voltage source is configured to generate a pass gate voltage, and is coupled to second memory transistors in the memory column. A probe is coupled to the first memory transistors. The erase verify voltage source is configured to generate the erase verify voltage, and is coupled to third memory transistors in the memory column. The pass gate voltage source is configured to generate the pass gate voltage, and is coupled to fourth memory transistors in the memory column. The logic circuitry is coupled to the probe, and configured to determine whether readings from the probe indicate a successful erase verify.

These and other advantages and features will become readily apparent in view of the following detailed description of embodiments of the invention. Note that the Summary and Abstract sections may set forth one or more, but not all exemplary embodiments of the present invention as contemplated by the inventor(s). It is to be appreciated that the Detailed Description section, and not the Summary and Abstract sections, is intended to be used to interpret the claims.

BRIEF DESCRIPTION OF THE DRAWINGS/FIGURES

The features and advantages of embodiments of the present invention will become more apparent from the detailed description set forth below when taken in conjunction with the drawings. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Figure 1:
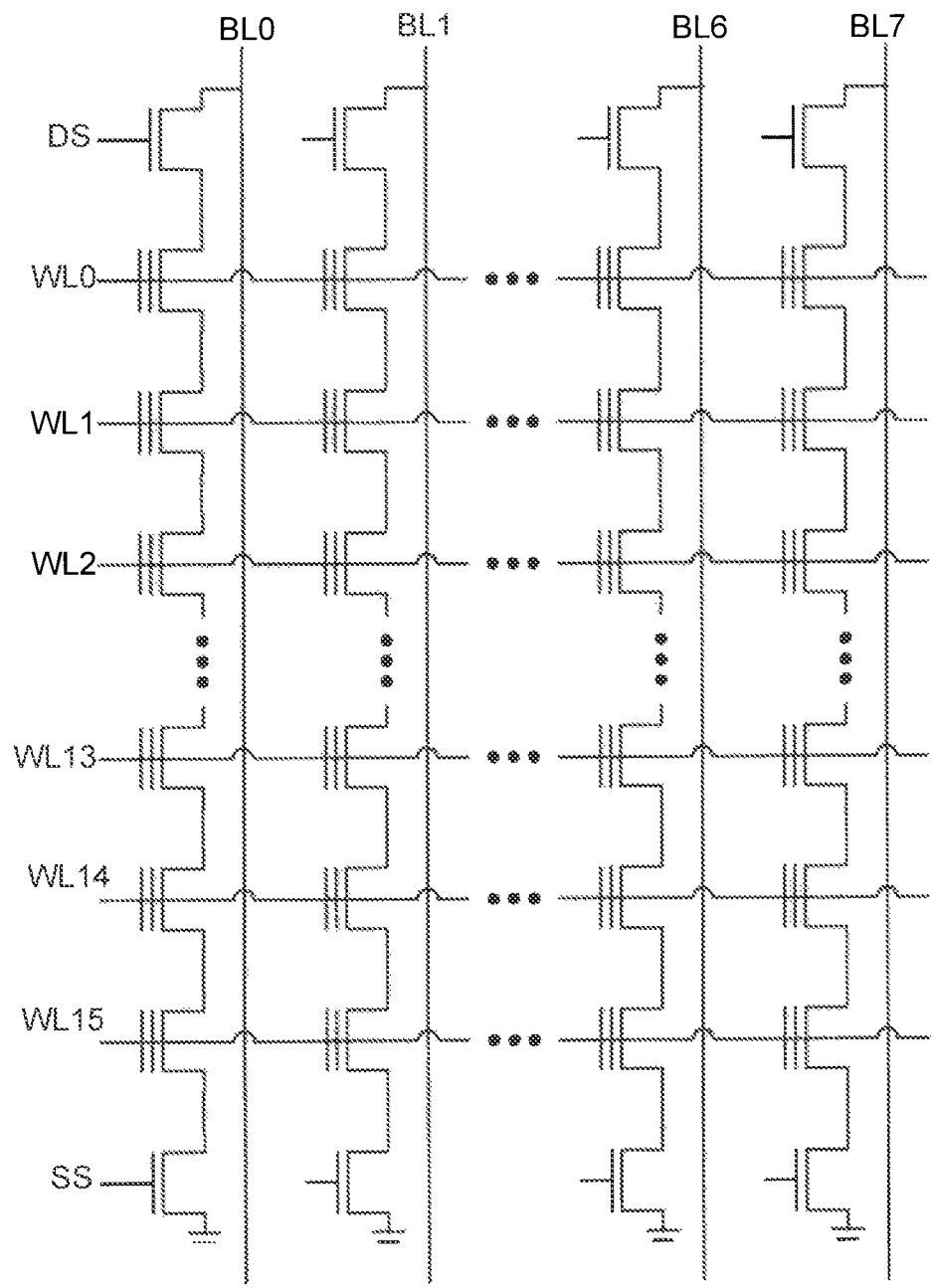
FIG. 1 illustrates a NAND FLASH memory array.

FIG. 1 illustrates a NAND FLASH memory array 100. Flash memory is a non-volatile memory in which charges are typically stored in the part of a cell known as the "storage node," such as a floating, poly-silicon transistor gate or a charge trap layer. To write to the cell, a relatively high voltage is applied to the transistor's control gate (via the word line of the memory), which results in charge being built up in the storage node. The cell is read by applying a relatively intermediate voltage to the control gate (via the word line of the memory) and determining whether the cell conducts current. In an embodiment, the storage node is interposed between the control gate and the oxide layer. Thus, the charge built up on the storage node when the cell is written to effectively increases the threshold voltage of the cell. Ideally, after the cell is programmed (i.e., written to with data), the threshold voltage of the cell is increased beyond the intermediate voltage applied during the read operation, thereby creating two different states that can be measured during the read operation (i.e., conducting when the cell stores a logical 1, and non-conducting when the cell stores a logical 0).

The memory array 100 is NAND FLASH memory because the cells are connected in series, that is, all of the word lines need to be activated for a bit line to be pulled to 1. The NAND memory array 100 is formed of n-type MOSFET memory cells, which are "OFF" when charged with electrons and "ON" when erased.

A FLASH memory cell is typically erased by applying a relatively large negative voltage across the control gate of the cell, the voltage having the opposite polarity as the programming voltage. The negative voltage is created by applying a large positive voltage to a high voltage p-well and setting the control gate to 0V. In doing so, the charges present on the storage node are pulled off and the cell conducts current when the intermediate voltage is applied during the read operation. If the cells are n-type MOSFETs, they are erased by writing a binary '1' to their storage nodes.

FLASH memories are typically composed of a number of fixed-size memory blocks. For example, and without limitation, each of the blocks can have a size of 1 megabit (Mbit). Other block sizes are possible and contemplated herein. Logical value 0s can be written to selective, or "random," bits of a block. However, in an embodiment, the only way logical value 1s can be written to a block is by erasing the entire block. Thus, in an embodiment, when data is to be written to a FLASH memory block, two operations must be completed. First, the block is erased (e.g., by writing logical value 1s to every cell of the block). Next, the block is written with logical value 0s to specific cells of the block. This pair of operations, erase and write, is termed a "P/E cycle." The 'P' stands for "program," another word for write.

Ideally, a FLASH memory block would be able to cycle infinitely. That is, a FLASH memory block would be able to be written and erased an infinite number of times. In practice, however, the performance of a FLASH memory block degrades. For example, as a block is exposed to more P/E cycles, the cells that make up the block tend to trap charges. These trapped charges result in the cells requiring voltages of higher voltage levels to be erased.

To erase a block of FLASH memory, a voltage pulse train is typically output to the block by a memory controller. After each pulse in the train, the memory controller determines whether all of the cells in the block have been erased. For example, the memory controller can compare the threshold voltages of the cell to a predetermined voltage to determine if the block has been erased. If the block is confirmed as having been erased, then no additional pulses are output to the block. Otherwise, the next pulse in the train is output to the block. As more pulses in the train are output, an increasing number of pulses are used per erase operation. Other embodiments may vary the voltage level of the pulses, or vary both the number of pulses and the voltage level of the pulses.

Figure 2:
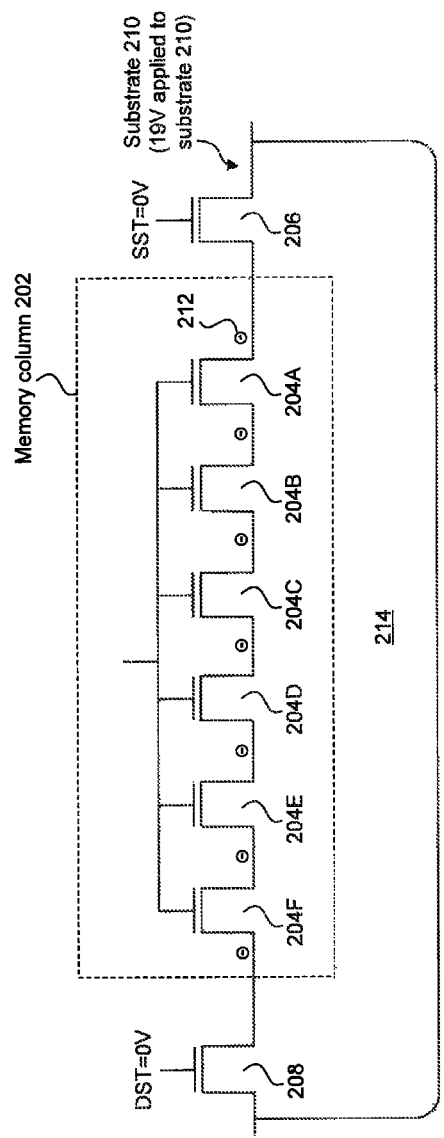
FIG. 2 illustrates a memory column being erased, according to an embodiment.

FIG. 2 illustrates a memory column 202, according to an embodiment. Memory column 202 is composed of a series of memory transistors 204. Memory column 202 is sandwiched between a source selection transistor 206 and a drain selection transistor 208. The transistors 204, 206 and 208 are n-type transistors, as are commonly used in NAND FLASH memory. The transistors 204, 206 and 208 are formed on a silicon substrate 210. The silicon substrate 210 is a portion of a silicon wafer. The embodiment of FIG. 2 has electrons 212 between the memory transistors 204, trapped in the silicon substrate 210. Part of the silicon substrate 210 is the high voltage p-well 214.

FIG. 2 does not illustrate dummy word lines, even though certain memory devices have them. Dummy word lines have transistors, but for the purposes of the claims, devices in a dummy word line should not be considered to be memory transistors 204.

FIG. 2 further illustrates the application of voltages to erase the memory transistors 204A-F. In an embodiment, memory transistors 204 A-F are erased by a high vertical electric field. The vertical electric field is created by applying an erase voltage to the substrate high voltage p-well 214. Word lines connected to the gates of memory transistors 204A-F are grounded, creating a −19V vertical field across the memory transistors 204A-F, which serves to erase them. The gates of the source select transistor 206 and the drain select transistor 208 are floating. The voltage on the gates gets close to the erase voltage through capacitive coupling. The "SST=0V" and "DST=0V" refers to the voltage across these transistors 206 and 208, not the voltage applied to their gates.

The vertical field is strong enough that electrons 212 get injected from the gate corner of the memory transistors 204A-F toward the surface of the substrate 210 and get trapped between the word lines. Electrons 212 trapped near the surface of substrate 210 pose a threat to the correct working of memory column 202, as discussed below.

Figure 3:
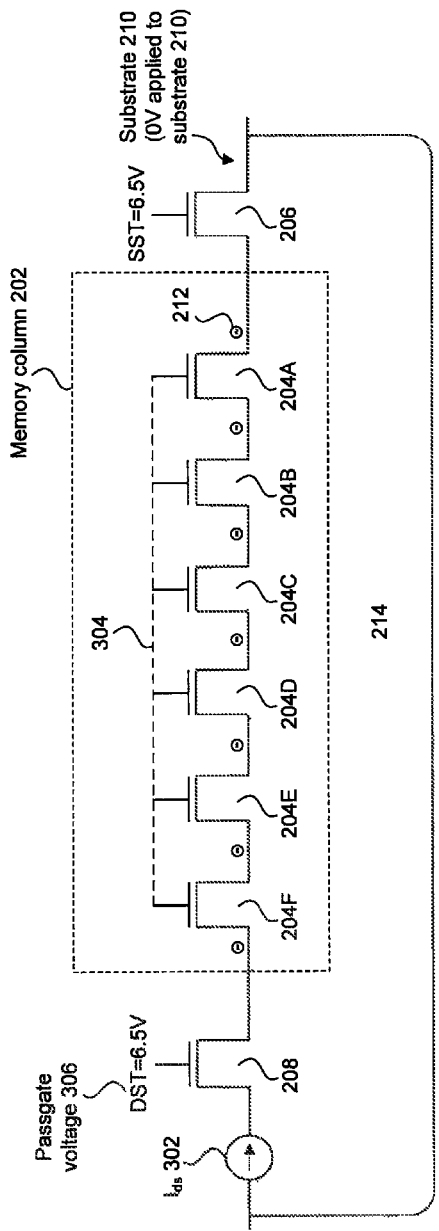
FIG. 3 illustrates a technique to perform erase verify, according to an embodiment.

FIG. 3 illustrates a technique to perform erase verify, shown in the context of the embodiment of FIG. 2. In FIG. 3, by applying different voltages than were illustrated in FIG. 2, one can verify whether the memory transistors 204A-F were successfully erased. Each of the memory transistors 204A-F has an erase verify voltage 304 applied. A dashed line is shown to indicate that providing the same voltage to each of the memory transistors 204A-F is optional. Providing different voltages to the memory transistors 204A-F will be described below. The source selection transistor 206 and the drain selection transistor 208 both have a pass gate voltage 306 applied. A query voltage is applied to the drain of the drain selection transistor 208. In one embodiment, the query voltage is applied via bit lines connected to the drain selection transistors 208 of various memory columns 202. The bit lines are charged to 1V, or other small positive voltage. Should a current, due to the query voltage, flow from the drain selection transistor 208 to the source selection transistor 206, then such a current is known as a string current, or the drain to source current, $I_{ds}$ 302.

According to the example of FIG. 3, the erase verify voltage 304 is 2V, but in other examples, it may be 1.5V. In certain embodiments, the erase verify voltage 304 may be a voltage sufficient to enable the memory transistors 204 to conduct.

The pass gate voltage 306, or $V_{pass}$, is set to a large enough voltage that transistor 204, 206 or 208 is turned on, regardless of any values written to any memory transistor 204. The primary reason for setting a high pass gate voltage 306 is to reduce the resistance of the memory column 202, but the pass gate voltage is also high enough to overcome the effects of any electrons 212 that may be trapped in the silicon substrate 210 nearby. In the embodiment of FIG. 3, the pass gate voltage 306 is 6.5 V. In other embodiments, the pass gate voltage could be 5V-7V, or other ranges based on the technology of the memory transistors 204, such as the film stack thicknesses.

In the example of FIG. 3, $I_{ds}$ 302 is created by applying 1V to the drain of the drain selection transistor 208. If all of the memory transistors 204 are fully erased, $I_{ds}$ 302 will drain through the memory column 202. If one of the memory transistors 204 has not been erased, i.e., has a stored '0', then this memory transistor 204 will interfere with $I_{ds}$ 302 such that $I_{ds}$ 302 will not drain the query voltage's charge from the drain of drain selection transistor 208.

The electrons 212 trapped in the silicon substrate 210 interfere with the ability of $I_{ds}$ 302 to traverse through the memory column 202. Once too many electrons 212 have been trapped, the trapped electrons 212 will have enough charge that the erase verify voltage, e.g., 2V, will not be high enough to turn on the active regions between the word lines in the silicon substrate 210, where the electrons 212 are trapped. Word lines, shown in FIG. 1, are horizontal traces that connect the memory transistors 204 in a given row. Word lines are often defined or formed by silicided polysilicon. For the purposes of a single memory column 202, the relevant space between the word lines is between the transistors 204, 206 and 208. The effect of the trapped electrons 212 may be equivalent to an increase in the threshold voltage for the memory transistor 204 around which the electrons 212 are trapped.

Graphs of the Challenges

Figure 4A:
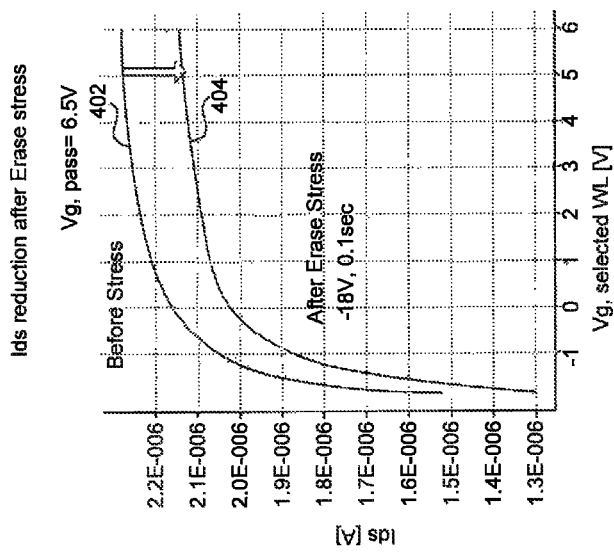
FIG. 4A is an exemplary graph of $I_{ds}$ reduction after erase stress.
Figure 4B:
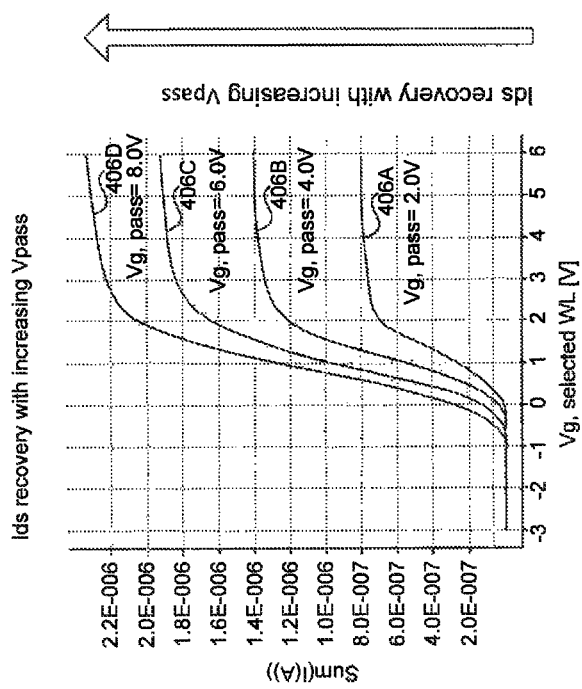
FIG. 4B is an exemplary graph of the effect on $I_{ds}$ of different pass gate voltages.

FIGS. 4A and 4B illustrate the challenges raised by "erase stress." Erase stress refers to the lingering negative effects of having applied such a large voltage, the erase voltage, to memory circuitry. As explained above, one example of a negative effect is the trapped electrons 212. FIG. 4A is a graph of $I_{ds}$ 302 reduction after erase stress. The Before Stress curve 402 depicts assessments of the embodiment of FIG. 3, where the voltage applied to the gate of one memory transistor 204A is swept from −2V to 6V, while the gates of the remaining memory transistors are biased to the pass gate voltage. The values for the graph of FIG. 4A reflect applying 6.5V to both the source selection transistor 206 and the drain selection transistor 208. FIG. 4A illustrates the amount of $I_{ds}$ 302 that is able to flow as the voltage applied to the gate, $V_g$, of the memory transistor 204A is raised. When $V_g$ is negative, small decreases can lead to large decreases in the amount of $I_{ds}$ 302 that is able to flow. However, increases in $V_g$ above 0V show small increases in $I_{ds}$ 302, particularly once $V_g$ is above the threshold voltage.

The After Erase Stress curve 404 depicts assessments of the same embodiment as in the Before Stress curve 402, after the memory transistor 204A has had an erase voltage applied (e.g., −18V for a tenth of a second, according to the embodiment of FIG. 4A). As noted with respect to FIG. 2, with such a large negative voltage electrons 212 get injected from the gate corner of the memory transistors 204A-F toward the surface of the substrate 210, leading to the possibility that electrons 212 may become trapped in the silicon substrate 210 between transistors 204, 206 and 208, as illustrated in FIG. 2. The electrons 212 that are trapped as a result of the "erase stress." As explained with respect to FIG. 3, trapped electrons 212 prevent memory transistor 204A from fully turning on. The trapped electrons 212 have the effect of increasing the threshold voltage of the memory transistor 204A, but not to the degree to turn it off. The effect of the negative charges between the word lines may be thought of as adding a resistor between the memory transistors 204; that is, every memory transistor 204 sees a large series resistance due to the trapped electrons 212. As memory transistor 204A does not fully turn on, a smaller portion of $I_{ds}$ 302 flows through memory transistor 204A. FIG. 4A illustrates that the reduction in $I_{ds}$ 302 can be approximately 200 nanoamperes between the stress curve 402 and the after stress curve 404.

FIG. 4B is a graph of the effect on $I_{ds}$ 302 of different pass gate voltages. The pass gate voltage curves 406 depict assessments of the embodiment of FIG. 3, where the voltage applied to the gate of one memory transistor 204A is swept from −2V to 6V, while the gates of the remaining memory transistors are biased to the pass gate voltage. For a given pass gate voltage curve 406, $I_{ds}$ 302 is approximately 0 until the voltage applied to the gate, $V_g$, of the memory transistor 204A is 0V for the 2.0V curve 406A or slightly above −1V for the 8.0V pass gate voltage curve 406D. Tracing the curves 406 from $V_g$=0V to $V_g$=2V, $I_{ds}$ 302 rises linearly, as the memory transistor 204A would be operating in the linear. $I_{ds}$ 302 has a markedly different value for each of the pass gate voltage curves 406A-D, reflecting that the pass gate voltage applied to the source selection transistor 206 and the drain selection transistor 208 limits the amount of $I_{ds}$ 302 that can flow through a memory column 202.

Flowchart of Method

Figure 5:
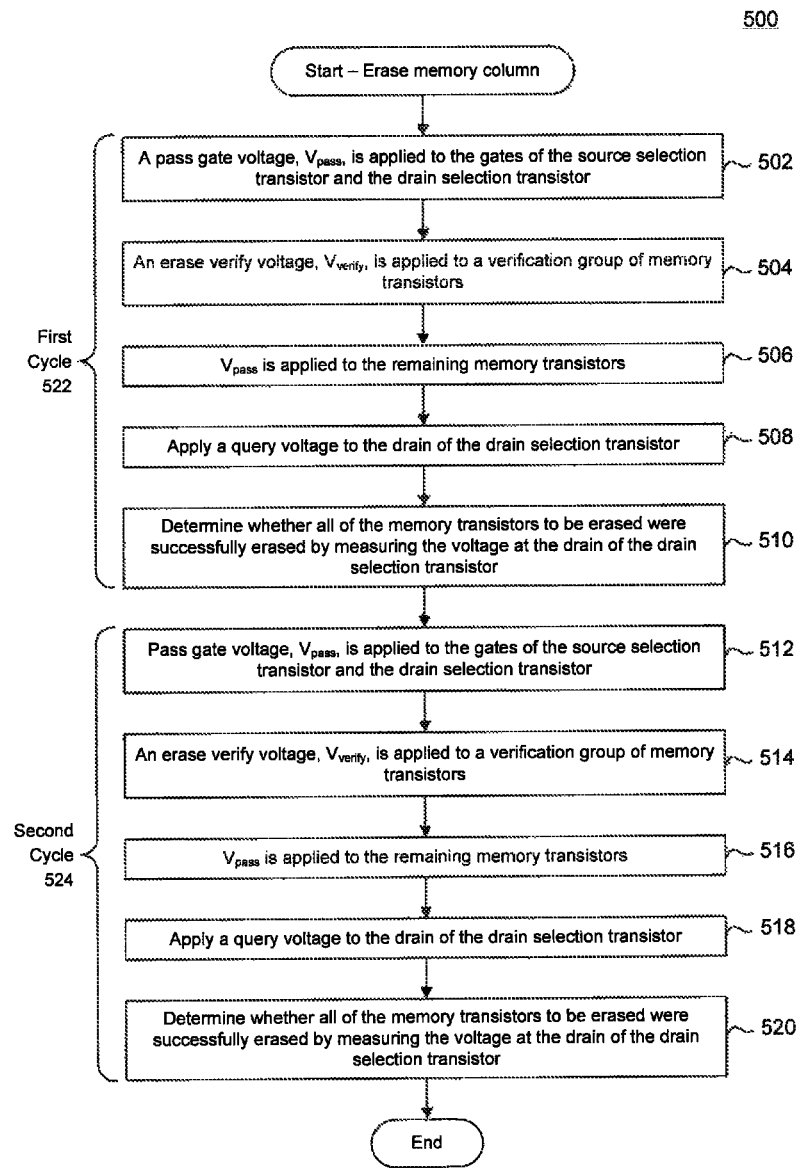
FIG. 5 is a flowchart of a method to perform erase verify on a memory column, according to an embodiment.

FIG. 5 is a flowchart of a method 500 to perform erase verify on a memory column 202, according to an embodiment. The method 500 of FIG. 5 is performed on the embodiment of FIGS. 2 and 3. The method 500 of FIG. 5 begins once the memory column 202 has been erased. It is noted that while FLASH memory has been referred to herein, the method 500 is applicable to other types of memory which exhibit the issues described herein.

In step 502, a pass gate voltage, $V_{pass}$, 306 is applied to the gates of the source selection transistor 206 and the drain selection transistor 208. Applying $V_{pass}$ 306 ensures that the source selection transistor 206 and the drain selection transistor 208 conduct.

In step 504, an erase verify voltage, $V_{verify}$, 304 is applied to a verification group of memory transistors 204. $V_{verify}$ 304 causes the memory transistors 204 that have been erased to conduct (in contrast, memory transistors 204 that are storing a logical 0 will not conduct). In one example, the verification group might be every other memory transistor 204, such as the odd numbered memory transistors 204A, 204C and 204E. In another example, the verification group might be every third memory transistor 204A and 204D. In an embodiment, any memory transistor 204 in the verification group has a transistor 204, 206 and 208 on either side that has $V_{pass}$ 306 applied. Applying $V_{pass}$ 306 to a neighboring transistor 204, 206 and 208 ensures that any electrons 212 trapped between such neighboring transistors 204, 206 and 208 will be overcome. In the following, the verification group is assumed to be memory transistors 204A, 204C and 204E, but the invention is not limited to this example.

In step 506, $V_{pass}$ 306 is applied to the remaining memory transistors 204B, 204D and 204F (i.e., any memory transistors 204B, 204D, and 204F not in the verification group). $V_{pass}$ 306 ensures that such remaining memory transistors 204B, 204D, and 204F conduct, regardless of whether they have been erased.

In step 508, a query voltage is applied to the drain of the drain selection transistor 208.

In step 510, it is determined whether memory transistors 204A, 204C and 204E in the verification group were successfully erased by measuring the voltage at the drain of the drain selection transistor 208. One type of probe that may be appropriate for this measurement is a sense amplifier. If the memory column 202 has been successfully erased, then $I_{ds}$ 302 traverses the memory column 202, such that the voltage at the drain of the drain selection transistor 208 is 0V (or at least the voltage is low enough compared to the reference). Conversely, if the query voltage still appears at the drain of the drain selection transistor, then at least memory transistor 204 was not erased. Approaches to remedying a memory transistor 204 that was not erased are discussed below.

In an embodiment, $V_{pass}$ 306, $V_{verify}$ 304 and the query voltage to create $I_{ds}$ 302 are applied while the measurement of step 510 is taken. Accordingly, steps 502-508 may be performed simultaneously, or at least overlap.

In an example, the verification group comprises half of the memory transistors 204 (such as memory transistors 204A, 204C and 204E). It is desirable to verify the erasure of all memory transistors 204 in a memory column 202, not just those in the verification group. It is also desirable that the erase verification occur as quickly as possible, such that the memory column 202 may be used for future operations sooner. In an embodiment, every other memory transistor 204, e.g., the odd numbered memory transistors 204A, 204C and 204E, is part of the verification group. This verification group allows each memory transistor 204 in the verification group to be between transistors 204B, 204D, 204F, 206 and 208 with a pass gate voltage 306 applied. This is the largest verification group possible that has neighboring transistors with pass gate voltages 306 applied.

As noted above, if the erase verification has been successful, the query voltage will drain from the drain of the drain selection transistor 208. This draining should occur within several microseconds.

Steps 502-510 represent a first cycle 522 of erase verification. Steps 512-520 represent a second cycle 524. The difference between the first cycle 522 and the second cycle 524 is that the verification and the remaining groups have their roles reversed, i.e., the remaining memory transistors 204 (i.e., the ones not in the verification group) will be erase verified in the second cycle 524. As a result, erasure of all of the memory transistors 204 in the memory column 202 will be confirmed. Accordingly, according to the above example, the second verification group is the even-numbered memory transistors 204B, 204D and 204F. The second group of remaining transistors is the odd-numbered memory transistors 204A, 204C and 204E.

In step 512, the pass gate voltage, $V_{pass}$ 306 is applied to the gates of the source selection transistor 206 and the drain selection transistor 208, as in step 502.

In step 514, the erase verify voltage, $V_{verify}$ 304 is applied to the second verification group of memory transistors 204B, 204D and 204F.

In step 516, $V_{pass}$ 306 is applied to the second group of remaining memory transistors 204A, 204C and 204E.

In step 518, a query voltage is applied to the drain of the drain selection transistor 208.

In step 520, it is determined whether the memory transistors 204B, 204D and in the second verification group were successfully erased by measuring the voltage at the drain of the drain selection transistor 208. If the memory column 202 has been successfully erased, then 1302 traverses the memory column 202, such that the voltage at the drain of the drain selection transistor 208 is 0V (or at least the voltage is low enough compared to the reference). Conversely, if the query voltage still appears at the drain of the drain selection transistor, then at least memory transistor 204 was not erased.

Other Embodiments

In another embodiment, the verification group of the first cycle 522 may be one third of the memory transistors 204 to be verified, for example, memory transistors 204A and 204D. In this embodiment, three cycles may be performed. In each of the three cycles, a different third of the memory transistors 204 are verified. For example, the first cycle may verify memory transistors 204A and 204D. The second cycle may verify memory transistors 204B and 204E. The third cycle may verify memory transistors 204C and 204F.

One advantage to the three cycle process is that it can overcome more electrons 212 trapped in the silicon substrate 210 than the two cycle process of the embodiment of FIG. 5 because the three cycle process has a larger number of memory transistors 204 receiving a pass gate voltage.

In contrast, one advantage of the two cycle process of the example of FIG. 5 is that it completes faster than the three cycle process because there is one less read cycle.

In an embodiment, the group of memory transistors 204 to be verified (i.e., the transistors in the verification group) in different cycles may overlap with each other, e.g., a memory transistor 204A may be verified more than once. Such a verification scheme may allow logic circuitry to detect that a smaller group of memory transistors 204 of the memory column 202 need to be erased a second time.

In an embodiment, it may be efficient to verify an equal number of memory transistors 204 in each cycle (or as close as can be evenly divided, as erase verification of a memory transistor 204 cannot be subdivided).

In situations where a probe detects that the voltage at the drain of the drain select transistor 208 is larger than expected, this may be interpreted as indicating that at least one memory transistor 204 of the group of memory transistors 204 to be verified was not completely erased. One approach to remedy this is to erase the memory transistors 204 a second (or third or more) time.

In an embodiment, if the voltage at the drain of the drain select transistor 208 is large enough (e.g., the query voltage) after the first cycle 522 (e.g., in step 510 of FIG. 5), it may be faster to skip the remaining verification cycles and apply an erase voltage to the entire memory column 202, and then restart method 500.

In another embodiment, if the voltage at the drain of the drain select transistor 208 is large enough (e.g., the query voltage), only the memory transistors 204 in the verification group that failed verification may have an erase voltage applied. This approach reduces the wear on the memory transistors 204 due to having erase voltages applied. This approach is not preferred because it requires applying the erase voltage to the remaining group either by connecting directly to the supply voltage or by floating the word lines. However, if a set of word lines is not verified, then most likely the other word lines need the erase pulse.

In another embodiment, if the voltage at the drain of the drain select transistor 208 is large enough (e.g., the query voltage), the erase voltage may be reapplied to the entire memory column 202 at the end of the process. Such an approach might require the least amount of circuitry to implement.

In an embodiment, additional erase verifications are performed after additional erasures. The erase voltage, e.g., −18V to −19V, will usually be the same voltage for each erasure. However, the erase voltage may vary.

While embodiments have been described herein with reference to FLASH memory, the invention is not limited to these examples. Instead, embodiments of the invention are applicable to other types of computer memory. The invention is useful for both charge-trapping and floating-gate devices. This invention may be implemented with p-type field effects transistors forming the memory column 202. This invention may be implemented with multi-level cells or other multi-bit memory technologies.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for erase verify of at least a portion of a memory column, the memory column including an arrangement of memory transistors, the method comprising:
    applying an erase voltage to the memory column;
    applying an erase verify voltage to first memory transistors in the memory column while applying a pass gate voltage to second memory transistors in the memory column;
    reading a verification electrical level to determine whether any of the first memory transistors were not successfully erased;
    applying the erase verify voltage to third memory transistors in the memory column while applying the pass gate voltage to fourth memory transistors in the memory column; and
    reading the verification electrical level to determine whether any of the third memory transistors were not successfully erased.

2. The method of claim 1, wherein the first and third memory transistors are not the same.

3. The method of claim 2, wherein the first memory transistors comprise every other memory transistor in the memory column.

4. The method of claim 1, wherein the first memory transistors and the third memory transistors collectively comprise all of the memory transistors in the memory column.

5. The method of claim 1, wherein the erase verify voltage is 1.5 volts to 2.0 volts.

6. The method of claim 1, wherein the pass gate voltage is approximately 6.5 volts.

7. The method of claim 1, wherein the first memory transistors consists of approximately half of the memory transistors of the memory column.

8. The method of claim 1, wherein the pass gate voltage is applied to two transistors adjacent to one of the first memory transistors.

9. The method of claim 1, wherein the memory column is part of a NAND flash memory device.

10. The method of claim 1, further comprising applying a second erase voltage to the memory column.

11. A memory circuitry, comprising:
    a memory column that includes an arrangement of memory transistors;
    an erase verify voltage source, configured to generate an erase verify voltage, coupled to first and third memory transistors in the memory column;
    a pass gate voltage source, configured to generate a pass gate voltage, coupled to second and fourth memory transistors in the memory column;
    a probe coupled to the first memory transistors; and
    logic circuitry, coupled to the probe, configured to determine whether readings from the probe indicate a successful erase verify.

12. The memory circuitry of claim 11, wherein the first and third memory transistors are different.

13. The memory circuitry of claim 12, wherein the first memory transistors comprises every other memory transistor in the memory column.

14. The memory circuitry of claim 11, wherein the erase verify voltage is approximately 1.5 volts to 2.0 volts.

15. The memory circuitry of claim 11, wherein the pass gate voltage is approximately 6.5 volts.

16. The memory circuitry of claim 11, wherein the first memory transistors consists of approximately half of the memory transistors of the memory column.

17. The memory circuitry of claim 11, wherein the pass gate voltage source is coupled to two transistors adjacent to a memory transistor of the first memory transistors.

18. The memory circuitry of claim 11, wherein the memory circuitry is a NAND flash memory device.

19. The memory circuitry of claim 11, wherein the logic circuitry is configured to conditionally trigger a second erase voltage.

20. The memory circuitry of claim 11, wherein the first memory transistors and the third memory transistors collectively comprise all of the memory transistors in the memory column.

* * * * *